United States Patent [19]
Al-Assadi et al.

[11] Patent Number: 5,757,816
[45] Date of Patent: May 26, 1998

[54] IDDQ TESTING OF INTEGRATED CIRCUITS

[75] Inventors: Waleed K. Al-Assadi, Austin, Tex.; Anura P. Jayasumura; Yashwant K. Malaiya, both of Fort Collins, Colo.

[73] Assignee: Advanced Micro Devices, Inc., Austin, Tex.

[21] Appl. No.: 736,623

[22] Filed: Oct. 24, 1996

[51] Int. Cl.$^6$ .................................................. G06F 11/00
[52] U.S. Cl. ........................................................ 371/21.1
[58] Field of Search ................................. 371/21.1, 21.4, 371/25.1, 22.1, 22.5, 22.6; 324/158.1

[56] References Cited

U.S. PATENT DOCUMENTS

| | | | |
|---|---|---|---|
| 5,506,499 | 4/1996 | Pupr | 324/158.1 |
| 5,592,077 | 1/1997 | Runas et al. | 324/158.1 |

OTHER PUBLICATIONS

W. K. Al-Assadi, et al.; "A Bipartite, Differential $I_{DDQ}$ Testable Static RAM Design;" Electrical Engineering and Computer Science Departments; Colorado State University; Fort Collins, Colorado 80523.

*Primary Examiner*—Vincent P. Canney
*Attorney, Agent, or Firm*—Skjerven, Morrill, MacPherson, Franklin & Friel, LLP; Kent B. Chambers

[57] ABSTRACT

An integrated circuit includes a circuit architecture that enhances the $I_{DDQ}$ testability of circuitry such as random access memories. Increased accuracy and test speed are achieved by partitioning the circuit array into multiple partitions. Pairs of partitions connected to a voltage source node and having substantially identical ground line capacitances are subdivided into respective blocks. Each block in a pair of the partitions includes a corresponding block in the other partition. Each of the corresponding blocks in a pair has a substantially equal ground line capacitance, and preferably each of the blocks has a substantially equal ground line capacitance. Pairs of corresponding blocks are coupled to respective built-in current comparators. Each block is preferably configured to include portions of non-contiguous, interleaved bit line segments and portions of non-contiguous, interleaved word lines. Simultaneous test vector corresponding block write operations followed by simultaneous read operations detect a multitude of $I_{DDQ}$ enhancing faults such as transition faults, state coupling and bridging faults, and neighborhood pattern sensitive faults. The built-in current comparators receive $I_{DDQ}$ currents from respective blocks and compare the currents to a predetermined threshold current. A responsive output signal is generated to indicate a pass/fail status based upon the comparison results. Additionally, in one embodiment, test vector generation circuitry uses a single test vector modification signal to modify test vectors to improve detection of $I_{DDQ}$ enhancing faults.

37 Claims, 4 Drawing Sheets

IDDQ TESTING OF INTEGRATED CIRCUITS

BACKGROUND OF THE INVENTION

1. Field of the Invention

This invention relates to integrated circuits and electronic systems and more particularly relates to a $I_{DDQ}$ testing including differential $I_{DDQ}$ testing of integrated circuits having partionable and block write/read features.

2. Description of the Related Art

Complexity of testing semiconductor memories has grown significantly along with the growing density of memory chips. With the increasing complexity of semiconductor memories, the nature of the failure modes have become more complex and subtle. Testing large memories is a complex and expensive process. Several techniques have been developed to overcome the problem of large test time, such as built-in self test (BIST) and testable designs. Failure modes such as gate-oxide shorts, bridging defects, parasitic transistor leakage, defective p-n junctions, and transistors with incorrect threshold voltages, may not affect logical behavior. Such faults may pass the functional and logical testing, but may malfunction over time, causing reliability hazards. Many of those faults cause elevated quiescent power supply current ($I_{DDQ}$), which is typically several orders of magnitude greater than the $I_{DDQ}$ of a fault-free device. In static random-access memories (SRAMs), most of the $I_{DDQ}$ testable faults are activated during the write/read cycles.

A write cycle forces most nodes to certain voltage levels, thus activating different faults. However, some faults may only be sensitized during the read cycle. Although writing to the cell is proper, the cell could flip its contents when electrically connected to the bit and $\overline{bit}$ lines. Such faults include coupling faults and neighborhood pattern sensitive faults.

$I_{DDQ}$ testing has been shown as an effective way in testing CMOS combinational circuits. $I_{DDQ}$ testing can also be effective in detecting SRAMs defects that escape traditional voltage monitoring techniques. In R. Meershoek, B. Verhest, R. McInerney and L. Thijssen, "Functional and $I_{DDQ}$ Testing on a Static RAM," *Proc. Int'l Test Conf*, pp. 929–937, 1990, an analysis of the effectiveness of the $I_{DDQ}$ testing has been done using SRAM of 8K ×8-bit words manufactured by Philips, using Inductive Fault Analysis technique. The results show that a high fault coverage is achieved when $I_{DDQ}$ testing is performed in combination with functional testing. In C. Kuo, T. Toms, B. T. Neel, J. Jelemensky, E. A. Carter, and P. Smith, "Soft-Defect Detection (SDD) Technique for a High-Reliability CMOS RAM," *IEEE Journal of Solid-State Circuits*, vol. 25, no. 1, pp. 61–66, February 1990, experimental results were reported on deploying current testing to detect defects that cause data retention problems. The idea of $I_{DDQ}$ testing is expanded for fault localization in C. Elm and D. Tavangarian, "Fault Detection and Fault Localization Using $I_{DDQ}$-Testing in Parallel Testable FAST-SRAMs," *Proc. IEEE VLSI Test Symp.*, pp. 380–385, April 1994. In S. T. Su and R. Z. Makki, "Testing of Static Random Access Memories by Monitoring Dynamic Power Supply Current," *Journal of Electronic Testing: Theory and Applications*, vol. 3, no. 3, August 1992, pp. 265–278, a testable SRAM structure was proposed for observing the internal switching behavior of the memory cells and provides a high coverage of disturb-type pattern sensitive faults. In W. K. Al-Assadi, Y. K. Malaiya, and A. P. Jayasumana, "Modeling of Intra-Cell Defects in CMOS SRAM," *Records of the 1993 IEEE International Workshop on Memory Testing*, pp. 78–81, August 1993, the detailed fault model of the 6-transistor memory cell was investigated for possible transistor level faults. It was shown that intra-cell defects can cause inter-cell faults in the memory array, such as coupling faults. Such faults were shown to cause elevated $I_{DDQ}$ when activated. In H. Yokoyama, H. Tamamoto, and Y. Narita, "A Current Testing for CMOS Static RAMs," *Records of the 1993 IEEE Int'l Workshop on Memory Testing*, pp. 137–142, August 1993, a testable design for memory array was shown to enhance $I_{DDQ}$ testing by allowing parallel access to the whole memory cells during the write cycle.

The above work clearly establishes the promise of $I_{DDQ}$ testing for SRAMs. However, it does not establish testability requirements that can improve the effectiveness of current testing. In addition, the above work does not address the problem of current measurements and the effects of the size of the circuit under test on the accuracy and testing speed. Typically, $I_{DDQ}$ is measured using a conventional built-in current sensor ("BICS") interposed between, for example, an entire memory array and ground. The BICS samples any current, and the current sample is evaluated. A stray or ground line capacitor field equal to the sum of capacitances coupled to ground degrades testing speed by delaying attainment of a steady state $I_{DDQ}$. Additionally, the BICS decreases the potential across the circuit array which further increases time to steady state.

In W. K. Al-Assadi, et al., "A Bipartite, Differential $I_{DDQ}$ Testable Static RAM Design," records of the 1995 Institute of Electrical and Electronic Engineers International Workshop on Memory Technology, Design and Testing, pp. 36–41, August 1995 ("W. K. Al-Assadi et al. Bipartite paper"), an $I_{DDQ}$ testing approach addresses a limited, special application of $I_{DDQ}$ testing related to word oriented SRAM array architecture i.e. all bits of a word are arranged contiguously in a word oriented architecture. The W. K. Al-Assadi et al. Bipartite paper discusses a built-in current comparator ("BICC") in the limited application of word oriented SRAM architecture. Additionally, the W. K. Al-Assadi et al. Bipartite paper addresses a limited two partition SRAM design. The W. K. Al-Assadi et al. Bipartite paper is incorporated herein by reference in its entirety.

SUMMARY OF THE INVENTION

Conventional $I_{DDQ}$ testing approaches do not satisfactorily maximize $I_{DDQ}$ fault detection in an efficient manner. In one embodiment of the present invention, efficient $I_{DDQ}$ testing is achieved by, for example, partitioning arrays of circuit elements and subdividing partitions into non-contiguous and interleaved blocks of circuit elements.

In one embodiment of the present invention, an integrated circuit includes a plurality of circuit elements coupled to a source potential node, and a plurality of partitions of the plurality of circuit elements, each of the plurality of partitions of circuit elements is coupled to a respective common node, and respective pairs of the plurality of partitions of circuit elements have substantially matching common node capacitances. The integrated circuit further includes a plurality of current comparators, each of the plurality of current comparators having (a) a plurality of input nodes, coupled to the respective common nodes of a respective pair of partitions having substantially matching common node capacitances, to receive quiescent source currents from the pair of coupled partitions of circuit elements, (b) a current reference input node to receive a current reference, (c) comparison circuitry coupled to the plurality of input nodes and the current reference node to compare the quiescent source currents from the pair of coupled partitions of circuit elements during a test operation to the current reference, and (d) a reference potential node coupled to the comparison circuitry.

In another embodiment of the present invention, a method of testing an integrated circuit includes the steps of applying test vectors to a plurality of partitions of circuit elements, wherein respective pairs of the plurality of partitions of circuit elements have substantially matching ground line capacitances and are coupled to a voltage source, detecting any quiescent source currents in the respective pairs of the plurality of partitions of circuit elements, comparing any quiescent source currents from each pair of coupled partitions of circuit elements to a current reference, and determining if any quiescent source currents from each pair of coupled partitions of circuit elements exceeds a predetermined threshold.

In still another embodiment of the present invention, a bit-oriented memory circuit includes a voltage source node, a plurality of memory cells coupled to the voltage source node and respective combinations of word lines and bit lines, the bit lines being divided among respective data bit segments, and a first partition of the memory cells coupled to a first ground node, and the first partition of memory cells has a ground line equal to C. The bit-oriented memory circuit further includes a first plurality of blocks of memory cells, wherein (a) each of the first plurality of blocks is a mutually exclusive subset of the first partition of memory cells and (b) each of the first plurality of blocks having memory cells of non-contiguous segments and non-contiguous word lines, and a second partition of the memory cells, coupled to a second ground node, and the first partition of memory cells also has a ground line substantially equal to C. The bit-oriented memory circuit further includesa second plurality of blocks of memory cells, wherein (a) each of the second plurality of blocks is a mutually exclusive subset of the second partition of memory cells, (b) each of the second plurality of blocks having memory cells of non-contiguous segments and non-contiguous word lines, and (c) corresponding pairs of blocks of the first and second plurality of blocks have substantially equal ground line capacitances and have memory cells coupled to portions of shared word lines, a threshold reference input node, and a current comparator having (a) first and second input nodes coupled to the first and second ground nodes of the first and second partitions, respectively, to receive any quiescent source currents from the first and second partitions of memory cells, (b) a third input node coupled to the threshold current input node, (c) circuitry to compare the quiescent source currents from the first and second partitions of memory cells, if any, with a threshold reference.

BRIEF DESCRIPTION OF THE DRAWINGS

Features appearing in multiple figures with the same reference numeral are the same unless otherwise indicated.

DETAILED DESCRIPTION OF THE PREFERRED EMBODIMENTS

The following description of the invention is intended to be illustrative only and not limiting.

Commercially viable integrated circuit fabrication processes are producing 0.25 micron geometries and recent announcements suggest successful fabrication of geometries as small as 0.18 microns. As integrated circuit dimensions continue to decrease, the probability of failure modes involving, for example, coupling faults increases. As the probability of these types of failure modes increase, $I_{DDQ}$ testing has achieved increased prominence.

Figure 1:
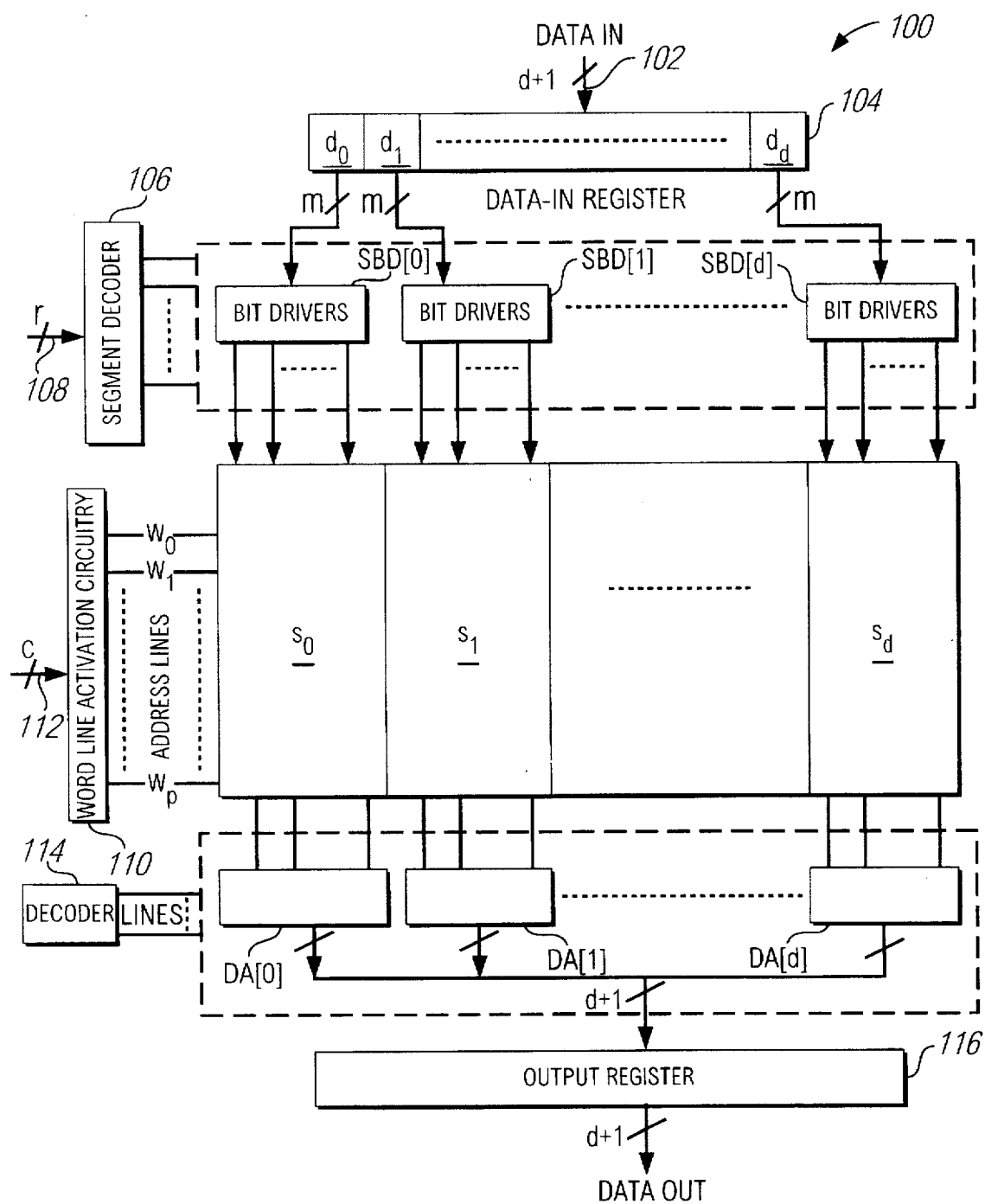
FIG. 1 is a bit-oriented memory architecture.

Referring to FIG. 1, memory 100 is a bit-oriented architecture configured into d+1 segments ranging from segment $S_0$ through $S_d$ ("S[d:0]") and p+1 word lines. Each bit of a logical word composed of d+1 bits is stored in a corresponding one of segments S[d:0], e.g. logical bit 0 is stored in segment S[0], logical bit 1 is stored in segment S[1], and so on with logical bit d stored in segment S[d]. During normal operation, memory 100 data of d+1 length is written by other integrated circuit assemblies via input line 102 into respective bit locations $d_d:d_0$ of d+1 bit data-in register 104. Segment decoder 106 receives an r-bit address signal on input line 108 and selects one of m bit drivers (not shown) in each of d+1 segment bit drivers SBD[d:0]. The segment bit drivers SBD[d:0] activate the selected bit line of each of segments S[d:0]. Word line decoder 110 receives a c-bit address signal on input line 112 to select and activate one of word lines W[p:0] of segments S[d:0]. Bit drivers and sense amplifiers DA[d:0] are connected to respective bit lines of segments S[d:0]. When a word location in memory 100 is selected for reading, decoder 114 appropriately selects bit drivers in each of bit drivers and sense amplifiers DA[d:0] to read the selected word location and store the output in d+1 bit output register 116.

Memory 100 may be implemented into a multitude of applications including integrated circuits and processor systems. Failure of memory 100 can result in an application failure. As a result, $I_{DDQ}$ testing is employed during manufacturing to detect and anticipate failures. Additionally, decreasing $I_{DDQ}$ testing times typically results in higher production throughput and corresponding increasing revenues.

Figure 2:
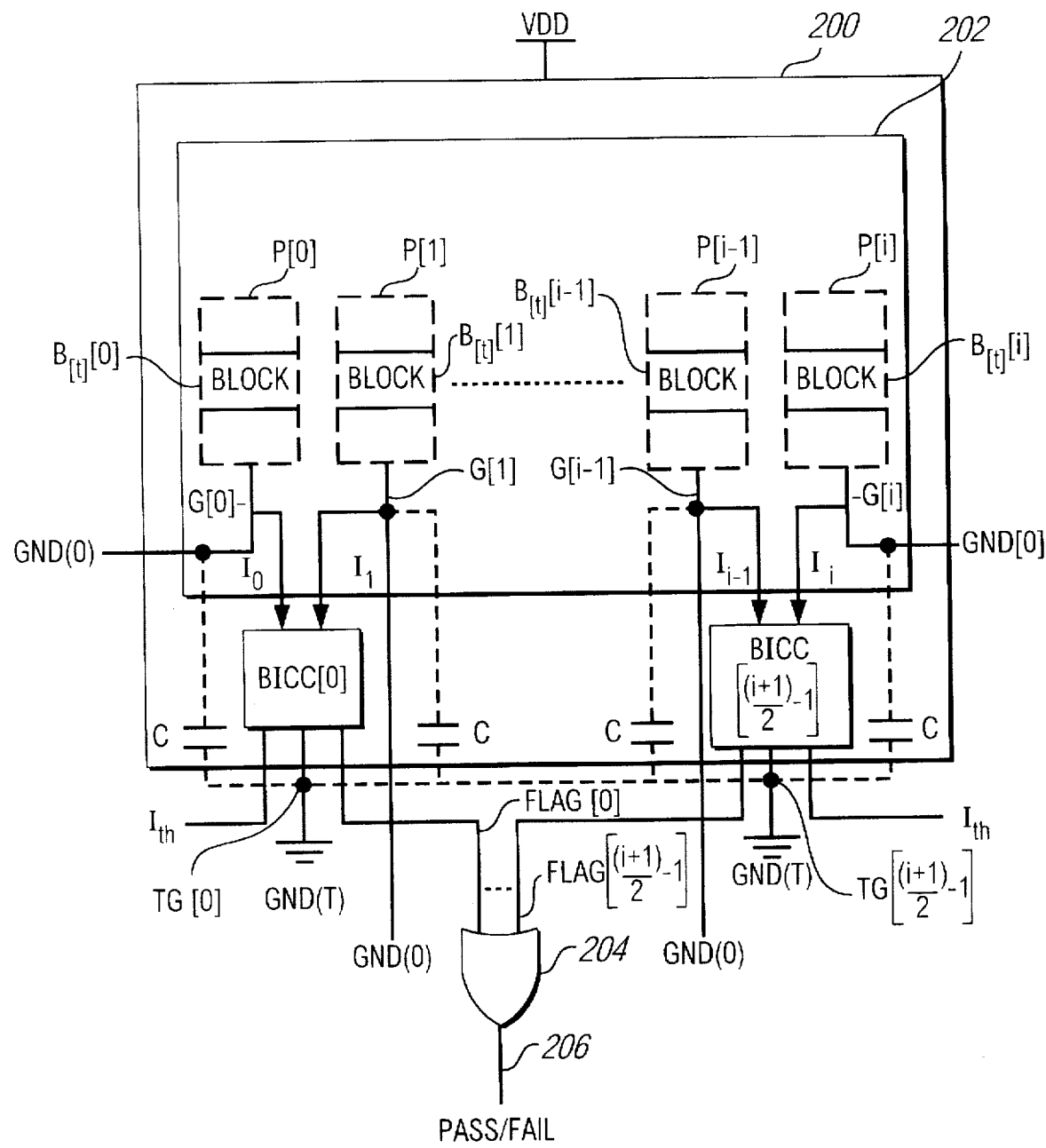
FIG. 2 is a multi-partitioned integrated circuit having differential $I_{DDQ}$ testing components.

Referring to FIG. 2, an integrated circuit 200 includes a circuit array 202 which is configured for differential $I_{DDQ}$ testing. Voltage for integrated circuit 200 is supplied from a power supply coupled to voltage source node Vdd which is generally on the order of 5 to 2.1 volts. Typically, Vdd is set to five volts for $I_{DDQ}$ testing purposes. The circuit array 202 is partitioned into i+1 partitions P[i:0] to divide a ground capacitance of circuit array 202 by i+1. Partitions P[i:0] are chosen to have nearly identical ground line capacitances C. Ground nodes G[i:0] of partitions P[i:0] are connected via conduction lines to a respective node of operational ground GND(O) and to one of built-in current comparators BICC[(i+1)/2-1:0]. Each of the built-in current comparators BICC[(i+1)/2-1:0] is connected to a respective node of test ground GND(T). During $I_{DDQ}$ testing, ground nodes G[i:0] are disconnected by a conventional circuit testing device from operational ground GND(0), and respective test ground nodes TG[(i+1)/2-1:0) are connected to respective built-in current comparators BICC[(i+1)/2-1:0]. Otherwise, partitions P[i:0] are connected to a node of operational ground GND(O). Coupling corresponding pairs of partitions to one of the built-in current comparators BICC[(i+1)/2-1:0] redirects any $I_{DDQ}$ current into the associated built-in current comparators BICC[(i+1)/2-1:0].

Partitions P[i:0] are predetermined divisions of circuit array 202 which preferably have substantially identical aggregate ground line capacitances C. Having matching ground line capacitances C allows use of identical threshold current Ith, discussed below. Additionally, the time constants associated with currents I[I:0] and ground line capacitances C are substantially the same, and changes in currents I[I:0] over time will be substantially the same. Although, each of ground line capacitances C is shown to be substantially identical, ground line capacitances C for different groups of partitions P[i:0] connected to different built-in current comparators BICC[(i+1)/2-1:0] may be different. In this case, threshold current Ith may be adjusted accordingly as described below.

In one embodiment, relatively large partitions P[i:0] are preferably further divided into (i+1) times (x+1) blocks $B_{[x:0]}[i:0]$. Each of partitions P[i:0] preferably has x+1 blocks. The number of blocks in different groups of partitions P[i:0] connected to different built-in current comparators BICC[(i+1)/2-1:0] may be different, but $I_{DDQ}$ testing may become unnecessarily complicated. Each of blocks $B_{[x:0]}[i:0]$ preferably have identical ground line capacitances equal to partition ground line capacitance C divided by x+1 (C/(x+1)). Thus, the ground line capacitances of each of blocks $B_{[x:0]}[i:0]$ substantially match, and time constants of $I_{DDQS}$ of an accessed blocks also substantially match. When partitions P[i:0] are divided into blocks $B_{[x:0]}[i:0]$, a block in a partition is accessed separately from other blocks in the partition. Thus, in this embodiment, during $I_{DDQ}$ testing, currents I[I:0] respectively represent $I_{DDQ}$ of an accessed block. The ground line capacitances of corresponding blocks $B_{[x:0]}[i:0]$ in partitions P[i:0] coupled to the same one of built-in current comparators BICC[(i+1)/2-1:0] having respective common test ground nodes TG[(i+1)/2-1:0] should be substantially identical. In one embodiment, corresponding block pairs are pairs of blocks in a pair of partitions having memory cells coupled to portions of shared word lines and coupled to one of built-in current comparators BICC[(i+1)/2-1:0] that have $I_{DDQS}$ being evaluated.

Built-in current comparators BICC[(i+1)/2-1:0] differentially compare their respective $I_{DDQ}$ input currents I[I:0] directly to each other, and an absolute value of the differential comparison result is compared to predetermined threshold current Ith. A. D. Singh, et al., "Incorporating $I_{DDQ}$ Testing in BIST: Improved Coverage through Test Diversity," Proc. Institute of Electrical and Electronic Engineers VLSI Test Symp., pp. 374–379, April 1994, incorporated herein by reference in its entirety, proposes a differential built-in comparator which provides another exemplary implementation of respective built-in current comparators BICC[(i+1)/2-1:0]. Each of built-in current comparators BICC[(i+1)/2-1:0] provides output signals FLAG[(i+1)/2-1:0], respectively. For all built-in current comparators BICC[(i+1)/2-1:0], if an absolute value difference of the $I_{DDQ}$ input currents to one of respective built-in current comparators BICC[(i+1)/2-1:0] is less than the threshold current Ith, then the respective one of output signals FLAG[(i+1)/2-1:0] is set to logical one ("high"). The logical one indicates an unacceptable fault in a block of blocks $B_{[x:0]}[i:0]$ connected to any of the built-in current comparators BICC[(i+1)/2-1:0] having the logical one output signal flag. A logical zero ("low") indicates an absence of an unacceptable fault. Generally, a failure in any of the blocks $B_{[x:0]}[i:0]$ of partitions P[i:0] equates to a failure of circuit array 202. A single pass/fail output signal indication is thus provided by detecting a logical one value of any of the output signals FLAG[(i+1)/2-1:0] of built-in current comparators BICC[(i+1)/2-1:0], respectively. In one embodiment, detection is achieved by applying each of the output signals FLAG[(i+1)/2-1:0] to input nodes of OR gate 204. A logical one pass/fail output signal on output line 206 indicates an unacceptable fault in circuit array 202, and a logical zero pass/fail output signal on output line 206 indicates no unacceptable faults. An unacceptable circuit array 202 also generally equates to an unacceptable integrated circuit 200.

Threshold current Ith is predetermined to approximately equal an unacceptable difference between $I_{DDQS}$ of tested partitions P[i:0] or of blocks $B_{[x:0]}[i:0]$ if partitions P[i:0] are subdivided into blocks. For example, in an SRAM block having one thousand memory cells, estimated normal leakage current is one nanoampere. Threshold current Ith may be set to one microampere to avoid false detections due to normal leakage current aggregated with acceptable $I_{DDQ}$ current while still detecting unacceptable $I_{DDQ}$ current. Because absolute value differential $I_{DDQS}$ from ground line capacitance matched circuits are compared to threshold current Ith, sampling and comparison of $I_{DDQS}$ may occur as soon as an unacceptable $I_{DDQ}$ is determined to develop to unacceptable levels. The $I_{DDQS}$ thus need not reach steady state values before the pass/fail output signal on output line 206 is valid. Thus, detection of an unacceptable circuit array 202 is accelerated which may correspond to decreased testing times and an increase in manufacturing throughput.

Furthermore, the $I_{DDQS}$ associated with blocks $B_{[x:0]}[i:0]$ are smaller than currents I[I:0] associated with partitions P[i:0] and smaller still with respect to circuit array 202 as a whole. Thus, the voltage drop across respective built-in current comparators BICC[(i+1)/2-1:0] is less than a voltage drop across a conventional BICS. The resolution of $I_{DDQS}$ associated with respective blocks $B_{[x:0]}[i:0]$ is thereby increased and $I_{DDQ}$ rise times correspondingly increase. The pass/fail output signal on output line 206 is valid earlier, and testing time is further reduced.

Referring to FIGS. 1 and 2, during a normal operation mode, only one of address lines W[p:0] and one bit line per segments S[d:0] is activated at a time. During a test mode, test vectors are written to and contents read from identical blocks of partitions such as block $B_{[r]}[0]$ of partition P[0] corresponding to block $B_{[r]}[1]$ of partition P[1] and block $B_{[r]}[i-1]$ of partition P[i-1] corresponding block $B_{[r]}[i]$ of partition P[i]]. Blocks $B_{[x:0]}[i:0]$ are arranged and predetermined test vectors are applied so that the probability of failing to detect a fault exposed by elevated $I_{DDQ}$ in circuit array 202 is very small, or, conversely, the probability of detecting a fault exposed by elevated $I_{DDQ}$ is high.

Figure 3:
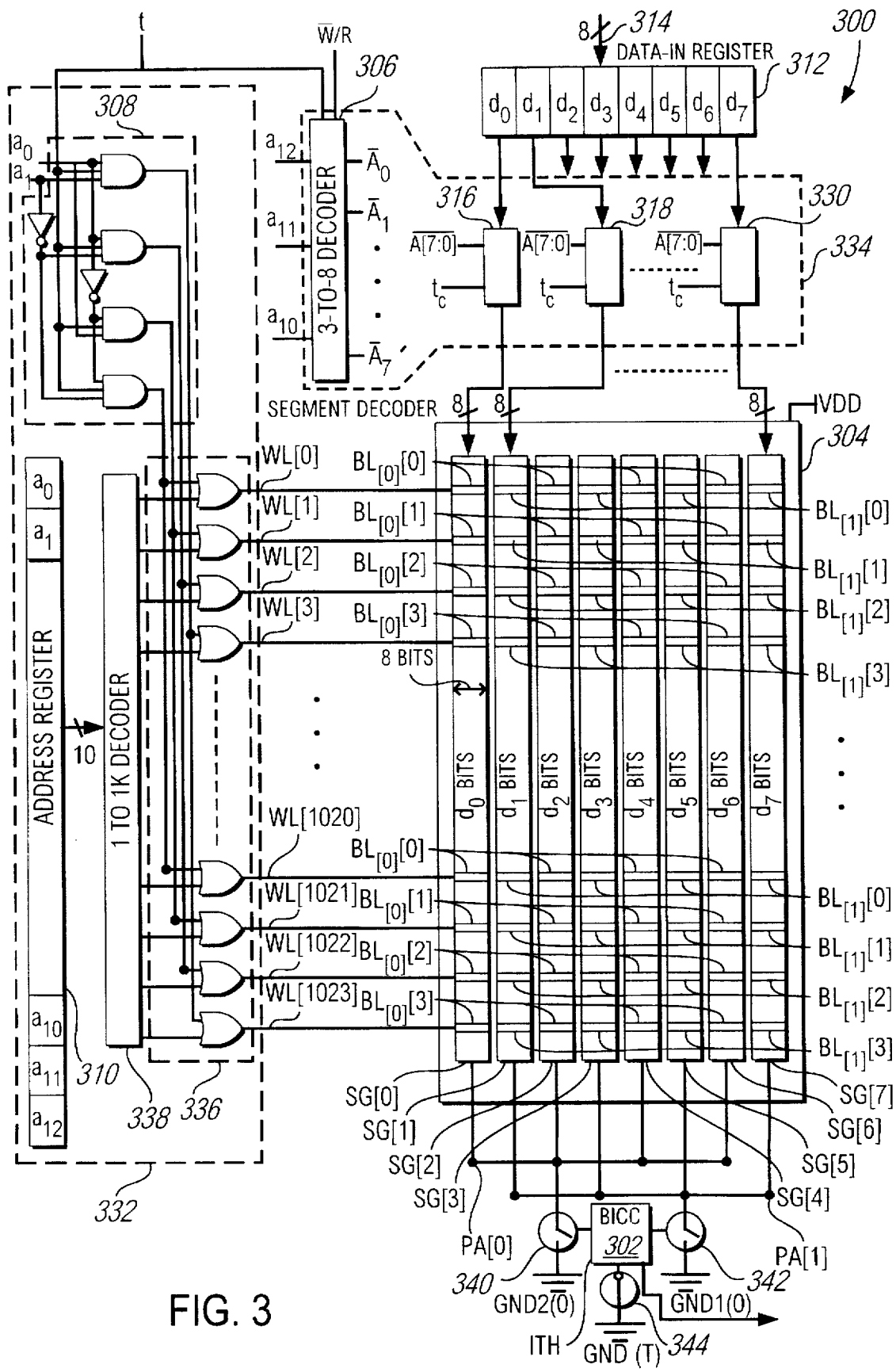
FIG. 3 is a partitioned and block subdivided bit-oriented memory array architecture with block read/write addressing.

Referring to FIG. 3, an embodiment of circuit array 202 is a partitioned and block subdivided bit-oriented memory circuit ("memory circuit") 300 with simultaneous block addressing test mode capabilities is illustrated. Memory circuit 300 is a bit-oriented 8K×8 SRAM. Faults that enhance $I_{DDQ}$ are, for example, mainly transition faults, state coupling and bridging faults, and neighborhood pattern sensitive faults. To detect $I_{DDQ}$ enhancing faults in the bit-oriented architecture of memory circuit 300, memory array 304 is preferably divided into two partitions PA[1:0] with partition PA[1] being subdivided into non-contiguous, interleaved 1K×8 blocks $BL_{[1]}[3:0]$ and partition PA[0] being subdivided into non-contiguous, interleaved 1K×8 blocks $BL_{[0]}[3:0]$. Signal W/R coupled to segment decoder 306 enables write and read operations, respectively.

Referring to FIG. 3, testing is substantially accelerated by simultaneous access of all shared word and bit lines in corresponding matching blocks of partitions PA[1:0]. During normal operations partitions PA[1:0] are connected to different nodes of operational ground node GND(0). In normal operation, 3×8 segment decoder 306 of bit line activation logic 334 decodes the three most significant address bits of address register 310 [$a_{12}:a_{10}$] into one of eight segment bit selector signals $\overline{A[7:0]}$. The segment bit selector signals $\overline{A[7:0]}$ are connected to control terminals in identical bit drive and pattern generation circuits 316, 318, 320, 322, 324, 326, 328, and 330 to select respective bits in a segment for access operations i.e. read/write operations. Note, bit drive and pattern generation circuits 320, 322, 324, 326, and 328 are not shown for clarity. In normal operational mode, only one of segment bit selector signals $\overline{A[7:0]}$ is brought to a logic zero.

During test operations, partitions PA[1:0] are disconnected from operational ground node GND(0) by switches 340 and 342, respectively, of attached test equipment (not shown), and test ground GND(T) is connected to built-in current comparator 302 via switch 344 of the attached test equipment. Segment decoder 306 is coupled to a test signal t. When test signal t is set to a logical one, all segment bit selector signals $\overline{A[7:0]}$ are simultaneously brought to a logic zero access to all bits in a segment selected by activated word lines.

During test operations 2 to 4 multiplexer 308 of word line activation logic 332 allows selective simultaneous access of all word lines in corresponding blocks, e.g. blocks $BL_{[0]}[0]$ and $BL_{[1]}[0]$. If partitions PA[1:0] are not subdivided into blocks, multiplexer 308 may not be needed. Multiplexer 308 includes two input nodes connected to the least significant address bits [$a_1:a_0$] of address register 310. Address bits [$a_1:a_0$] separately select one of four output lines at any one time. Each of the four output lines is coupled to a respective one of the first four OR gate input nodes of word line drive circuitry 336 to drive word lines WL[3:0], respectively, and to every word line in increments of four thereafter. Test signal t enables multiplexer 308 during test operations. During normal operations multiplexer 308 is not enabled and performs no role therein. During test operations, 1×1K decoder 338 preferably provides no output signals. Thus, each combination of four address bits [$a_1:a_0$] selects one fourth of the memory array 304 word lines which equates to simultaneous selection of word lines in two corresponding blocks. It will be understood that word line drive circuitry 336 may implemented in a variety of circuitry which may dictate the appropriate contents of address register 310 to achieve the functionality described herein.

Furthermore, several measures increase the probability of detecting an $I_{DDQ}$ enhancing fault. For example, compared to non-interleaved, contiguous blocks, blocks $BL_{[1:0]}[3:0]$ arranged into respective interleaved, non-contiguous blocks have a higher probability of avoiding parallel defects due to fabrication techniques that may replicate a defect. This interleaved, contiguous configuration scheme is illustrated in FIG. 3 with block $BL_{[0]}[0]$ of partition PA[0] being composed of all bits in segments SG[0], SG[2], SG[4], and SG[6] of every forth word line beginning with WL[0]. Block $BL_{[0]}[1]$ of partition PA[0] is composed of all bits in segments SG[0], SG[2], SG[4], and SG[6] of every forth word line beginning with WL[1]. Block $BL_{[1]}[2]$ of partition PA[0] is composed of all bits in segments SG[0], SG[2], SG[4], and SG[6] of every forth word line beginning with WL[2]. Block $BL_{[0]}[3]$ of partition PA[0] is composed of all bits in segments SG[0], SG[2], SG[4], and SG[6] of every forth word line beginning with WL[3]. Block $BL_{[1]}[0]$ of partition PA[1] is composed of all bits in segments SG[1], SG[3], SG[5], and SG[7] of every forth word line beginning with WL[0]. Block $BL_{[1]}[1]$ of partition PA[1] is composed of all bits in segments SG[1], SG[3], SG[5], and SG[7] of every forth word line beginning with WL[1]. Block $BL_{[1]}[2]$ of partition PA[1] is composed of all bits in segments SG[1], SG[3], SG[5], and SG[7] of every forth word line beginning with WL[2]. Block $BL_{[1]}[3]$ of partition PA[1] is composed of all bits in segments SG[1], SG[3], SG[5], and SG[7] of every forth word line beginning with WL[3].

Non-contiguous, interleaving of blocks $B_{[x:0]}[i:0]$ increases the ability of detection by built-in current comparators BICC[(i+1)/2-1:0] of $I_{DDQ}$ enhancing faults in memory circuit 300. For example, writing to a memory cell in word line WL[1] may activate or stimulate $I_{DDQ}$ flow from a contiguous word line which might not be detected if all contiguous word lines were accessed approximately simultaneously. Additionally, when using differential $I_{DDQ}$ testing, non-contiguous, interleaving of blocks $B_{[x:0]}[i:0]$ generally avoids duplicate faults in corresponding blocks and associated duplicate $I_{DDQS}$.

Further exemplary measures that increase the probability of detecting an $I_{DDQ}$ enhancing fault involve use of predetermined test vectors and predetermined test sequences. During test operations, eight bit test vectors are written via eight bit data input lines 314 into respective bit positions of eight bit data register 312.

Figure 4:
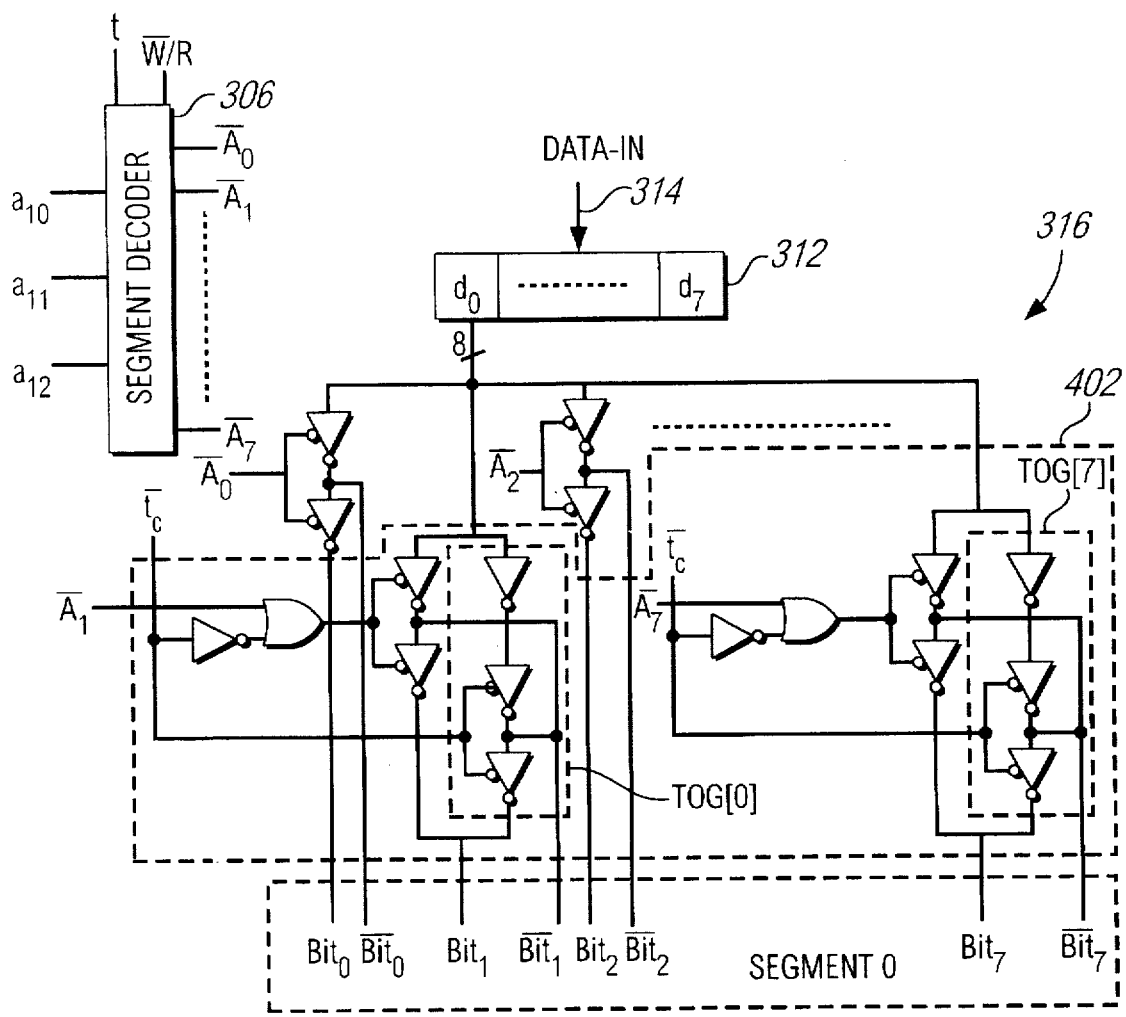
FIG. 4 is a bit drive and test pattern generation circuit.

Referring to FIG. 4 during test operations segment bit selector signals $\overline{A[7:0]}$ are all activated to a logic zero to activate all bit lines of memory array 304. Segment bit selector signals $\overline{A[0]}$, $\overline{A[2]}$, $\overline{A[4]}$, and $\overline{A[6]}$ are coupled to control terminals of serial inverters which drive data bits d0, d2, d4, and d6 of data register 312 onto bit lines [0, 2, 4, and 6], respectively, and drive the complement data bits dO, d2, d4, and d6 onto complement bit lines [0, 2, 4, and 6], respectively. Bit drive and test pattern generation circuit 316 includes an input node to receive test vector modification signal $\overline{tc}$. Segment bit selector signals $\overline{A[1]}$, $\overline{A[3]}$, $\overline{A[5]}$, and $\overline{A[7]}$ are connected to inputs of OR gates associated with bit lines [1, 3, 5, and 7] and bit complement lines [1, 3, 5, and 7]. Test vector modification signal $\overline{tc}$ is connected through an inverter to a control input of each of the OR gates associated with bit lines [1, 3, 5, and 7] and bit complement lines [1, 3, 5, and 7]. During a test operation, when test vector modification signal $\overline{tc}$ is set to logical zero by external testing equipment, bit test vector modification signal $\overline{tc}$ selects toggling circuits TOG [7:0] of test vector modification circuitry 402 which complements data bits d1, d3, d5, and d7 of data register 312. Toggling circuits TOG[7:0] each are a pair of serially connected inverters following a single inverter. The inverters drive complemented data bits d1, d3, d5, and d7 onto bit lines [1, 3, 5, and 7], respectively, and drive data bits d1, d3, d5, and d7 onto complement bit lines [1, 3, 5, and 7]. During a test operation, when test vector modification signal $\overline{tc}$ is set to one, data bits d1, d3, d5, and d7 are their complements are driven onto bit lines [1, 3, 5, and 7] and complement bit lines [1, 3, 5, and 7], respectively, unaltered. Bit drive and pattern generation circuits 318, 320, 322, 324, 326, 328, and 330 are implemented identically to bit drive and test pattern generation circuit 316.

Referring to FIG. 3, memory cells in a pair of corresponding blocks having word lines activated by address bits [$a_1:a_0$] store the data bits d[7:0] in all eight segments SG[7:0] simultaneously. As a result of test vector modification signal $\overline{tc}$, the number of test vectors may be doubled by toggling $\overline{tc}$. Test vector modification signal $\overline{tc}$ assists in minimizing the complexity of testing devices connected to memory circuit 300.

A sequence of test vectors are applied to memory circuit 300 to detect $I_{DDQ}$ enhancing faults. Homogenous patterns of 1111 1111 and 0000 0000 detect, for example, stuck-at faults and a large fraction of state coupling and bridging faults. Alternating patterns of 0101 0101 and 1010 1010 detect complex pattern sensitive faults by stimulating $I_{DDQ}$ faults in adjacent memory cells connected to a common word line. The test vectors are written to all corresponding block pairs of all indicated in Table 1.

TABLE 1

| test vector modification signal $\overline{tc}$ | Read/Write operation | Selected Block | Test vector |
|---|---|---|---|
| 0 | Write | $BL_{[1:0]}[0]$ | 0000 0000 |
| 0 | Write | $BL_{[1:0]}[1]$ | 1111 1111 |
| 0 | Write | $BL_{[1:0]}[2]$ | 0000 0000 |
| 0 | Write | $BL_{[1:0]}[3]$ | 1111 1111 |
| 0 | Read | $BL_{[1:0]}[0]$ | |
| 0 | Read | $BL_{[1:0]}[1]$ | |
| 0 | Read | $BL_{[1:0]}[2]$ | |
| 0 | Read | $BL_{[1:0]}[3]$ | |
| 1 | Write | $BL_{[1:0]}[0]$ | 0101 0101 |
| 1 | Write | $BL_{[1:0]}[1]$ | 1010 1010 |
| 1 | Write | $BL_{[1:0]}[2]$ | 0101 0101 |
| 1 | Write | $BL_{[1:0]}[3]$ | 1010 1010 |
| 1 | Read | $BL_{[1:0]}[0]$ | |
| 1 | Read | $BL_{[1:0]}[1]$ | |
| 1 | Read | $BL_{[1:0]}[2]$ | |
| 1 | Read | $BL_{[1:0]}[3]$ | |

The sequence of test vector operations stimulate any $I_{DDQ}$ flow in partitions PA[1:0]. Any $I_{DDQ}$ flow is sampled by built-in current comparator 302, preferably differentially as described above. Built-in current comparator 302 functions identically to respective built-in current comparators BICC [(i+1)/2:0]. The $I_{DDQ}$ difference is compared by built-in current comparator 302 to threshold current Ith. If the $I_{DDQ}$ difference is greater than threshold current Ith, then built-in current comparator 302 provides a logic high fail signal. If the $I_{DDQ}$ difference is less than or equal to threshold current Ith, then built-in current comparator 302 provides a logic zero pass signal. Because differential currents are utilized $I_{DDQ}$ steady state does not have to be achieved, as described above. Additionally, because memory cells in respective corresponding blocks of blocks $B_{[x:0]}[i:0]$ are accessed approximately simultaneously, respective ground line capacitances are proportionally less than the ground line capacitance of memory array 304 as a whole. As a result $I_{DDQ}$ rise times are significantly improved. Additionally, because $I_{DDQ}$ of a block is generally less than $I_{DDQ}$ of memory array 304 as a whole, the voltage drop across built-in current comparator 302 is proportionately less. The resolution due to a corresponding increased voltage drop across a respective block of memory cells is increased which also reduces $I_{DDQ}$ rise times.

Features described herein which include differential $I_{DDQ}$ sampling, block subdivisions to decrease ground line capacitances and enhance $I_{DDQ}$ rise times, and simultaneous block read/write operations notably increase testing speeds of circuits such as SRAM circuits. Furthermore, the non-contiguous, interleaved block arrangements and test vector schemes detect $I_{DDQ}$ enhancing faults.

Memory array 304 may be divided into two pairs of corresponding partitions by coupling the divided partitions to respective operational ground nodes and adding an additional built-in current comparator. Each pair of partitions is coupled to a respective built-in current comparator.

W. K. Al-Assadi, "Differential $I_{DDQ}$ Testable Static RAM Architecture," Institute of Electrical and Electronic Engineers International Workshop on $I_{DDQ}$ Testing, Oct. 25–26, 1995, pp. 54–59, which is herein incorporated by reference in its entirety, provides another embodiment of differential $I_{DDQ}$ testing.

Although various circuits including memory circuits have been described herein, the spirit of the $I_{DDQ}$ testing features and processes may be used in many semiconductor integrated circuits. It will be understood that the embodiments and variations of the embodiments described herein are well-suited for use in an integrated circuit chip, as well as an electronic system having a microprocessor, a memory, and a system bus.

While the invention has been described with respect to the embodiments and variations set forth above, these embodiments and variations are illustrative and the invention is not to be considered limited in scope to these embodiments and variations. Accordingly, various other embodiments and modifications and improvements not described herein may be within the spirit and scope of the present invention, as defined by the following claims.

What is claimed is:

1. An integrated circuit comprising:
   a plurality of circuit elements coupled to a source potential node;
   a plurality of partitions of the plurality of circuit elements, each of the plurality of partitions of circuit elements is coupled to a respective common node, and respective pairs of the plurality of partitions of circuit elements have substantially matching common node capacitances; and
   a plurality of current comparators, each of the plurality of current comparators having (a) a plurality of input nodes, coupled to the respective common nodes of a respective pair of partitions having substantially matching common node capacitances, to receive quiescent source currents from the pair of coupled partitions of circuit elements, (b) a current reference input node to receive a current reference, (c) comparison circuitry coupled to the plurality of input nodes and the current reference node to compare the quiescent source currents from the pair of coupled partitions of circuit elements during a test operation to the current reference, and (d) a reference potential node coupled to the comparison circuitry.

2. An integrated circuit as in claim 1 further comprising:
   a plurality of blocks of circuit elements, wherein (a) each block is a subset of one of the plurality of partitions of circuit elements, (b) each respective pair of the plurality of partitions of circuit elements includes a like number of the blocks of circuit elements, (c) corresponding blocks of circuit elements in a pair of the plurality of partitions of circuit elements are coupled to the common node, and (d) corresponding blocks of circuit elements have substantially matching common node capacitances.

3. An integrated circuit as in claim 2 wherein (a) the circuit elements include a plurality of groups of memory cells arranged into columns and rows, (b) each column of memory cells is coupled to a respective word line, (c) each row of memory cells is allocated to one of a group of segments of memory cells and is coupled to a respective bit line, and (d) each of the blocks of circuit elements comprises non-contiguous word lines and non-contiguous segments.

4. An integrated circuit as in claim 3 wherein (a) each of the plurality of partitions of circuit elements includes four of the blocks, (b) each block includes four non-contiguous, interleaved segments, and (c) each block includes memory cells of the four non-contiguous segments coupled to a respective one of a first four word lines and every fourth word line thereafter.

5. An integrated circuit as in claim 1 wherein (a) the circuit elements include a plurality of groups of memory cells arranged into columns and rows, (b) each row of memory cells is coupled to a respective word line, and (c) each column of memory cells is allocated to one of a group of segments of memory cells and is coupled to a respective bit line, the integrated circuit further comprising:

a test vector modification signal having a first state and a second state;

a plurality of data input lines coupled to each bit line to provide a test vector; and test vector generation circuitry, coupled to the test vector modification signal and to the data input lines, to modify the test vector on the data input lines if the test vector modification signal has the first state and to pass the test vector unaltered if the test vector modification signal has the second state.

6. An integrated circuit as in claim 2 wherein the plurality of circuit elements comprise a memory array of a bit-oriented static random access memory.

7. An integrated circuit as in claim 6 wherein (a) the circuit elements of the bit-oriented static random access memory include a plurality of groups of memory cells respectively allocated to respective blocks of circuit elements and arranged into columns and rows, (b) each row of memory cells is coupled to a respective word line, (c) each column of memory cells is allocated to one of a group of segments of bit lines and coupled to a respective bit line, (d) each of the blocks of circuit elements includes (A) portions of non-contiguous, interleaved word lines coupled to a group of memory cells and (B) portions of non-contiguous, interleaved segments, and (e) corresponding blocks of circuit elements include respective portions of shared word lines.

8. An integrated circuit as in claim 7 further comprising:

a test signal having a test state and a non-test state; and bit line activation circuitry, coupled to the test signal and bit lines, to generate segment bit line selector signals and, if the test signal has the test state, to responsively activate all segment bit lines with the segment bit line selector signals; and word line activation circuitry, coupled to the test signal and word lines, to generate word line selector signals, and if the test signal has the test state, to responsively activate at least a portion of the word lines.

9. An integrated circuit as in claim 8 wherein the bit line activation circuitry comprises:

a segment decoder, coupled to the test signal, the segment decoder having (a) a plurality of input nodes to respectively receive the test signal, (b) circuitry to generate the segment bit line selector signals, and (c) a plurality of output nodes to provide the segment bit line selector signals, wherein if the test signal has the test state, the segment decoder circuitry generates segment bit line selector signals indicating selection of all bit lines; and bit line drive circuitry coupled to the segment decoder output nodes and to the segment bit lines, the bit line drive circuitry being responsive to the segment bit line selector signals to drive all of the segment bit lines.

10. An integrated circuit as in claim 8 further comprising:

a number of address signals sufficient to select a number of corresponding block pairs coupled to shared word lines;

wherein the word line activation circuitry comprises:

word line drive circuitry coupled to the word lines; and a multiplexer coupled to (a) the test signal, (b) the address signals, and (c) the word line drive circuitry, wherein the multiplexer, in response to the test signal having a test state and to the address signals, enables the word line drive circuitry to approximately simultaneously select for activation by the word line drive circuitry only the shared word lines of corresponding blocks of circuit elements.

11. An integrated circuit as in claim 7 further comprising:

a test signal having a test state and a non-test state; and a plurality of bit line selection circuits coupled to the test signal, wherein, if the test signal has the test state, the bit line selection circuits approximately simultaneously select all of the bit lines of the plurality of partitions of circuit elements.

12. An integrated circuit as in claim 7 further comprising:

a test signal having a test state and a non-test state; and a plurality of word line selection circuits coupled to the test signal, wherein, if the test signal has the test state, the word line selection circuits approximately simultaneously select at least a portion of the word lines of the plurality of partitions of circuit elements.

13. An integrated circuit as in claim 12 wherein the word line selection circuits approximately simultaneously select all of the word lines of the plurality of partitions of circuit elements.

14. An integrated circuit as in claim 12 further comprising:

a multiplexer coupled to the test signal, the word line selection circuits, and to a number of address signals sufficient to respectively select all of the blocks of circuit elements, wherein the multiplexer, in response to the test signal having a test state and to the address signals, enables the word line selection circuits to approximately simultaneously select only all of the word lines in a block of circuit elements.

15. An integrated circuit as in 1 wherein each of the plurality of partitions of circuit elements includes substantially matching common node capacitances.

16. An integrated circuit as in 1 wherein the comparison circuitry is capable of comparing an absolute value difference between quiescent source currents from the pair of coupled partitions of circuit elements to the current reference.

17. An integrated circuit as in claim 2 wherein each of the plurality of blocks of circuit elements include substantially matching common node capacitances.

18. An electronic system including a microprocessor, a memory, and a system bus, and further including the integrated circuit as in claim 1.

19. A method of testing an integrated circuit comprising the steps of:

applying test vectors to a plurality of partitions of circuit elements, wherein respective pairs of the plurality of partitions of circuit elements have substantially matching ground line capacitances and are coupled to a voltage source;

detecting any quiescent source currents in the respective pairs of the plurality of partitions of circuit elements;

comparing any quiescent source currents from each pair of coupled partitions of circuit elements to a current reference; and determining if any quiescent source currents from each pair of coupled partitions of circuit elements exceeds a predetermined threshold.

20. A method as in claim 19 wherein the step of detecting any quiescent source currents in the respective pairs of the plurality of partitions of circuit elements comprises the steps of:
   detecting any quiescent source currents in respective blocks of the plurality of partitions, wherein (a) each block is a subset of one of the plurality of partitions of circuit elements, (b) each respective pair of the plurality of partitions of circuit elements includes a like number of the blocks of circuit elements, and (c) corresponding blocks of circuit elements have substantially matching common node capacitances.

21. A method as in claim 20:
   wherein the step of comparing any quiescent source currents from each pair of coupled partitions of circuit elements to a current reference comprises the step of:
      comparing any quiescent source currents in corresponding blocks of circuit elements to the current reference; and
   wherein the step of determining if any quiescent source currents from each pair of coupled partitions of circuit elements exceeds the predetermined threshold comprises the step of:
      determining if any of the quiescent source currents of the corresponding blocks of circuit elements exceeds the predetermined threshold.

22. A method as in claim 21 further comprising the steps of:
   approximately simultaneously accessing all circuit elements in a pair of corresponding blocks in each of the plurality of partitions of circuit elements; and
   repeating the approximately simultaneously accessing step for each pair of corresponding blocks in each of the plurality of partitions of circuit elements.

23. A method as in claim 19 wherein the integrated circuit includes a bit-oriented memory array, wherein (a) circuit elements of the bit-oriented memory array include a plurality of groups of memory cells arranged into columns and rows, (b) each row of memory cells is coupled to a respective word line, and (c) each column of memory cells is allocated to one of a group of segments and coupled to a respective bit line, the method further comprising the steps of:
   receiving a test signal having a test state and a non-test state;
   activating all of the bit lines in the bit-oriented memory array in response to the test signal having the test state; and
   activating at least a portion of the word lines in the bit-oriented memory array in response to the test signal.

24. A method as in claim 23 wherein the bit-oriented memory array includes blocks of memory cells, wherein (a) each block is a subset of one of the plurality of partitions of circuit elements, (b) each respective pair of the plurality of partitions of circuit elements includes a like number of the blocks of memory cells, (c) corresponding blocks of memory cells have substantially matching ground line capacitances, (d) each of the blocks of circuit elements includes (A) portions of non-contiguous word lines coupled to a group of memory cells and (B) portions of non-contiguous segments, and (e) respective groups of corresponding blocks of memory cells each include respective portions of shared word lines, and wherein the step of activating at least a portion of the word lines in the bit-oriented memory array comprises the step of:
   approximately simultaneously activating all of the word lines of a group of corresponding blocks of memory cells.

25. A method as in claim 24 further comprising:
   receiving a number of address signals sufficient to select a group of corresponding blocks of memory cells;
   wherein the step of approximately simultaneously activating all of the word lines of a group of corresponding blocks of memory cells comprises:
      receiving address signals selecting a group of corresponding blocks of memory cells;
      coupling a drive signal to the shared word lines of the group of corresponding blocks selected by the address signals, if the test signal has the test state.

26. A method as in claim 19 wherein (a) the circuit elements include a plurality of groups of memory cells arranged into columns and rows, (b) each row of memory cells is coupled to a respective word line, and (c) each column of memory cells is coupled to a respective bit line, the method further comprising the step of:
   receiving a test vector modification signal having a first state and a second state;
   receiving respective test vectors;
   wherein the step of applying test vectors to a plurality of partitions of circuit elements includes the steps of:
      (a) activating bit lines corresponding to a received test vector if the test vector modification signal has the first state;
      (b) modifying the received test vector, if the test vector modification signal has the second state;
      (c) if the test vector is modified, activating the bit lines with the modified test vector; and
      repeating steps (a), (b), and (c) for other received test vectors.

27. A method as in claim 26 wherein the step of modifying the received test vector includes the step of:
   toggling alternate bits of the received test vector.

28. A method as in claim 19 wherein the step of comparing comprises the step of:
   comparing an absolute value difference between any quiescent source currents from each pair of coupled partitions of circuit elements to the current reference.

29. A method as in claim 28 wherein the step of determining comprises the step of:
   determining if the difference between quiescent source currents from each pair of coupled partitions of circuit elements exceeds the predetermined threshold.

30. An integrated circuit chip implementing the method of claim 19.

31. An electronic system having a processor, a memory, and a bus implementing the method of claim 19.

32. A bit-oriented memory circuit comprising:
   a voltage source node;
   a plurality of memory cells coupled to the voltage source node and respective combinations of word lines and bit lines, the bit lines being divided among respective data bit segments;
   a first partition of the memory cells coupled to a first ground node, and the first partition of memory cells has a ground line equal to C;
   a first plurality of blocks of memory cells, wherein (a) each of the first plurality of blocks is a mutually exclusive subset of the first partition of memory cells and (b) each of the first plurality of blocks having memory cells of non-contiguous segments and non-contiguous word lines;
   a second partition of the memory cells, coupled to a second ground node, and the first partition of memory cells also has a ground line substantially equal to C;

a second plurality of blocks of memory cells, wherein (a) each of the second plurality of blocks is a mutually exclusive subset of the second partition of memory cells, (b) each of the second plurality of blocks having memory cells of non-contiguous segments and non-contiguous word lines, and (c) corresponding pairs of blocks of the first and second plurality of blocks have substantially equal ground line capacitances and have memory cells coupled to portions of shared word lines;

a threshold reference input node; and a current comparator having (a) first and second input nodes coupled to the first and second ground nodes of the first and second partitions, respectively, to receive any quiescent source currents from the first and second partitions of memory cells, (b) a third input node coupled to the threshold current input node, (c) circuitry to compare the quiescent source currents from the first and second partitions of memory cells, if any, with a threshold reference.

33. A bit-oriented memory circuit as in claim 32 further comprising:

a test signal having a test state and a non-test state;

a number of address signal(s) sufficient to select each of the pairs of corresponding blocks;

bit line activation circuitry, coupled to the test signal and the bit lines, to generate segment bit line selector signals and, if the test signal has the test state, to responsively activate all segment bit lines with the segment bit line selector signals; and word line activation circuitry, coupled to the test signal, the word lines, and the address signals, to generate word line selector signals and activate word lines selected by the address signal(s) corresponding to the shared word lines of a corresponding pair of blocks if the test signal has the test state.

34. A bit-oriented memory circuit as in claim 33 wherein the bit line activation circuitry comprises:

a segment decoder, coupled to the test signal, the segment decoder having (a) a plurality of input nodes to respectively receive the test signal, (b) circuitry to generate the segment bit line selector signals, and (c) a plurality of output nodes to provide the segment bit line selector signals, wherein if the test signal has the test state, the segment decoder circuitry generates segment bit line selector signals indicating selection of all bit lines; and bit line drive circuitry coupled to the segment decoder output nodes and to the segment bit lines, the bit line drive circuitry being responsive to the segment bit line selector signals to drive all of the segment bit lines.

35. A bit-oriented memory circuit as in claim 33 wherein the wherein the word line activation circuitry comprises:

word line drive circuitry coupled to the word lines; and a multiplexer coupled to (a) the test signal, (b) the address signals, and (c) the word line drive circuitry, wherein the multiplexer, in response to the test signal having a test state and to the address signals, enables the word line drive circuitry to approximately simultaneously select for activation by the word line drive circuitry only shared word lines of a corresponding pair of blocks.

36. A bit-oriented memory circuit as in claim 32 further comprising:

a test vector modification signal input node to receive a test vector modification signal having a fist state and a second state;

a plurality of data input lines coupled to each bit line to provide a test vector; and test vector generation circuitry, coupled to the test vector modification signal and to the data input lines, to modify the test vector on the data input lines if the test vector modification signal has the first state and to pass the test vector unaltered if the test vector modification signal has the second state.

37. A bit-oriented memory circuit as in claim 36 wherein the test vector generation circuitry includes circuitry to toggle the test vector if the test vector modification signal has the second state.

* * * * *

UNITED STATES PATENT AND TRADEMARK OFFICE
CERTIFICATE OF CORRECTION

PATENT NO.     :  5,757,816
ISSUE DATE     :  May 26, 1998
INVENTOR(S)    :  Al-Assadi, et al It is certified that error appears in the above-identified patent and that said Letters Patent is hereby corrected as shown below:

Col. 3, line 35; delete "includesa" and insert -- includes a --

Signed and Sealed this

Second Day of November, 1999

Attest:

Attesting Officer

Q. TODD DICKINSON

Acting Commissioner of Patents and Trademarks